(12) United States Patent
Noma et al.

(10) Patent No.: US 7,662,670 B2
(45) Date of Patent: *Feb. 16, 2010

(54) MANUFACTURING METHOD OF SEMICONDUCTOR DEVICE

(75) Inventors: Takashi Noma, Gunma (JP); Hiroyuki Shinogi, Gunma (JP); Akira Suzuki, Gunma (JP); Yoshinori Seki, Gunma (JP); Koichi Kuhara, Tokyo (JP); Yukihiro Takao, Gunma (JP); Hiroshi Yamada, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 462 days.

This patent is subject to a terminal disclaimer.

(21) Appl. No.: 11/488,890

(22) Filed: Jul. 19, 2006

(65) Prior Publication Data

US 2007/0026639 A1 Feb. 1, 2007

Related U.S. Application Data

(63) Continuation-in-part of application No. 10/696,581, filed on Oct. 30, 2003, now Pat. No. 7,101,735.

(30) Foreign Application Priority Data

Oct. 30, 2002 (JP) .............................. 2002-315418

(51) Int. Cl.
*H01L 21/44* (2006.01)
(52) U.S. Cl. ................ 438/114; 438/465; 257/E21.523
(58) Field of Classification Search .................. 438/110, 438/112–114, 33, 68, 458, 460, 465; 257/E21.523
See application file for complete search history.

(56) References Cited

U.S. PATENT DOCUMENTS 3,648,131 A 3/1972 Stuby (Continued)

FOREIGN PATENT DOCUMENTS

DE 19846232 3/2000

(Continued)

OTHER PUBLICATIONS

Thomas Luxbacher Ph. D. et al. (1999) "Spray Coating for MEMS Interconnect & Advanced Packaging Applications," Fujifilm Interface 42$^{nd}$ Interface Microlithography Symposium, 5 pages.

(Continued)

*Primary Examiner*—Thanhha Pham
(74) *Attorney, Agent, or Firm*—Morrison & Foerster LLP

(57) ABSTRACT

A glass substrate is bonded through a resin to the top surface of a semiconductor wafer on which a first wiring is formed. A V-shaped groove is formed by notching from the back surface of the wafer. A second wiring connected with the first wiring and extending over the back surface of the wafer is formed. A protection film composed of an organic resin or a photoresist layer to provide protection with an opening is formed on the second wiring by spray coating. A conductive terminal is formed by screen printing using the protection film as a solder mask. A cushioning material may be formed on the back surface of the wafer by spray coating.

21 Claims, 16 Drawing Sheets

U.S. PATENT DOCUMENTS

| | | | |
|---|---|---|---|
| 3,756,872 A | 9/1973 | Goodman | |
| 3,787,252 A | 1/1974 | Filippazzi et al. | |
| 4,954,875 A | 9/1990 | Clements | |
| 4,978,639 A | 12/1990 | Hua et al. | |
| 5,229,647 A | 7/1993 | Gnadinger | |
| 5,350,662 A | 9/1994 | Chi | |
| 5,476,819 A | 12/1995 | Warren | |
| 5,648,684 A | 7/1997 | Bertin et al. | |
| 5,682,062 A | 10/1997 | Gaul | |
| 5,691,245 A | 11/1997 | Bakhit et al. | |
| 5,895,234 A | 4/1999 | Taniguchi et al. | |
| 5,895,970 A | 4/1999 | Miyoshi et al. | |
| 5,904,546 A | 5/1999 | Wood et al. | |
| 5,910,687 A * | 6/1999 | Chen et al. | 257/784 |
| 5,927,993 A | 7/1999 | Lesk et al. | |
| 5,998,866 A | 12/1999 | Ochi et al. | |
| 6,002,163 A | 12/1999 | Wojnarowski | |
| 6,027,958 A | 2/2000 | Vu et al. | |
| 6,042,922 A | 3/2000 | Senoo et al. | |
| 6,051,489 A | 4/2000 | Young et al. | |
| 6,054,760 A | 4/2000 | Martinez-Tovar et al. | |
| 6,066,513 A | 5/2000 | Pogge et al. | |
| 6,110,825 A | 8/2000 | Mastromatteo et al. | |
| 6,136,668 A | 10/2000 | Tamaki et al. | |
| 6,184,060 B1 | 2/2001 | Siniaguine | |
| 6,221,751 B1 | 4/2001 | Chen et al. | |
| 6,259,039 B1 | 7/2001 | Chroneos et al. | |
| 6,300,224 B1 | 10/2001 | Arima et al. | |
| 6,316,287 B1 | 11/2001 | Zandman et al. | |
| 6,326,689 B1 | 12/2001 | Thomas | |
| 6,339,251 B2 | 1/2002 | Ha et al. | |
| 6,358,772 B2 | 3/2002 | Miyoshi | |
| 6,362,529 B1 | 3/2002 | Sumikawa et al. | |
| 6,399,463 B1 | 6/2002 | Glenn et al. | |
| 6,406,934 B1 | 6/2002 | Glenn et al. | |
| 6,420,211 B1 | 7/2002 | Brunet et al. | |
| 6,424,031 B1 | 7/2002 | Glenn | |
| 6,432,744 B1 | 8/2002 | Amador et al. | |
| 6,433,418 B1 | 8/2002 | Fujisawa | |
| 6,485,814 B1 | 11/2002 | Moriizumi et al. | |
| 6,506,681 B2 | 1/2003 | Grigg et al. | |
| 6,552,426 B2 | 4/2003 | Ishio | |
| 6,597,059 B1 | 7/2003 | McCann et al. | |
| 6,607,941 B2 | 8/2003 | Prabhu et al. | |
| 6,611,052 B2 | 8/2003 | Poo et al. | |
| 6,624,505 B2 | 9/2003 | Badehi | |
| 6,646,289 B1 | 11/2003 | Badehi | |
| 6,649,931 B2 | 11/2003 | Honma et al. | |
| 6,693,358 B2 | 2/2004 | Yamada | |
| 6,703,689 B2 | 3/2004 | Wada | |
| 6,720,661 B2 | 4/2004 | Hanaoka et al. | |
| 6,753,936 B2 | 6/2004 | Tanaka | |
| 6,780,251 B2 | 8/2004 | Tometsuka | |
| 6,781,244 B2 | 8/2004 | Prabhu | |
| 6,805,279 B2 | 10/2004 | Lee et al. | |
| 6,812,573 B2 | 11/2004 | Shimoishizaka | |
| 6,828,175 B2 | 12/2004 | Wood et al. | |
| 6,848,177 B2 | 2/2005 | Swan et al. | |
| 6,864,172 B2 | 3/2005 | Noma et al. | |
| 6,894,386 B2 | 5/2005 | Poo et al. | |
| 6,964,915 B2 | 11/2005 | Farnworth et al. | |
| 7,045,870 B2 | 5/2006 | Wataya | |
| 7,064,047 B2 | 6/2006 | Fukasawa et al. | |
| 7,067,354 B2 | 6/2006 | Prabhu | |
| 7,101,735 B2 * | 9/2006 | Noma et al. | 438/114 |
| 7,208,340 B2 | 4/2007 | Noma | |
| 7,271,466 B2 | 9/2007 | Noma et al. | |
| 7,312,107 B2 | 12/2007 | Noma et al. | |
| 7,312,521 B2 | 12/2007 | Noma et al. | |
| 7,399,683 B2 | 7/2008 | Noma et al. | |
| 7,456,083 B2 | 11/2008 | Noma et al. | |
| 2001/0005043 A1 | 6/2001 | Nakanishi et al. | |
| 2002/0005400 A1 | 1/2002 | Gat | |
| 2002/0016024 A1 | 2/2002 | Thomas | |
| 2002/0022343 A1 | 2/2002 | Nonaka | |
| 2002/0025587 A1 | 2/2002 | Wada | |
| 2002/0038890 A1 | 4/2002 | Ohuchi | |
| 2002/0047210 A1 | 4/2002 | Yamada | |
| 2002/0048889 A1 | 4/2002 | Hayama et al. | |
| 2002/0076855 A1 | 6/2002 | Pierce | |
| 2002/0089043 A1 | 7/2002 | Park et al. | |
| 2002/0105591 A1 | 8/2002 | Nakamura et al. | |
| 2002/0110953 A1 | 8/2002 | Ahn et al. | |
| 2002/0139577 A1 | 10/2002 | Miller | |
| 2002/0158060 A1 | 10/2002 | Uchiyama et al. | |
| 2002/0185725 A1 | 12/2002 | Moden et al. | |
| 2003/0077878 A1 | 4/2003 | Kumar et al. | |
| 2003/0094683 A1 | 5/2003 | Poo et al. | |
| 2003/0134453 A1 | 7/2003 | Prabhu et al. | |
| 2003/0216009 A1 | 11/2003 | Matsuura et al. | |
| 2003/0230805 A1 | 12/2003 | Noma et al. | |
| 2004/0017012 A1 | 1/2004 | Yamada et al. | |
| 2004/0041260 A1 | 3/2004 | Wood et al. | |
| 2004/0137701 A1 | 7/2004 | Takao | |
| 2004/0142509 A1 | 7/2004 | Imai | |
| 2004/0161920 A1 | 8/2004 | Noma et al. | |
| 2004/0229405 A1 | 11/2004 | Prabhu | |
| 2004/0235270 A1 | 11/2004 | Noma et al. | |
| 2005/0095750 A1 | 5/2005 | Lo et al. | |
| 2005/0208735 A1 | 9/2005 | Noma et al. | |
| 2005/0221585 A1 | 10/2005 | Perregaux et al. | |
| 2005/0266660 A1 | 12/2005 | Behammer | |
| 2006/0068572 A1 | 3/2006 | Noma et al. | |
| 2006/0079019 A1 | 4/2006 | Kim | |
| 2006/0270093 A1 | 11/2006 | Noma et al. | |
| 2007/0026639 A1 | 2/2007 | Noma et al. | |
| 2007/0117352 A1 | 5/2007 | Lee et al. | |
| 2007/0138498 A1 | 6/2007 | Zilber et al. | |
| 2007/0166957 A1 | 7/2007 | Kameyama et al. | |
| 2008/0093708 A1 | 4/2008 | Noma et al. | |
| 2008/0265424 A1 | 10/2008 | Noma et al. | |
| 2009/0023249 A1 | 1/2009 | Honer et al. | |

FOREIGN PATENT DOCUMENTS

| | | |
|---|---|---|
| DE | 10238444 | 3/2004 |
| EP | 0468874 | 1/1992 |
| EP | 1 041 617 | 10/2000 |
| EP | EP-1085570 | 3/2001 |
| EP | 1376678 | 1/2004 |
| EP | 1429377 | 6/2004 |
| FR | 2 767 223 | 2/1999 |
| JP | 62-094925 | 5/1987 |
| JP | 62-101678 | 5/1987 |
| JP | 3-152942 | 6/1991 |
| JP | 3-286553 | 12/1991 |
| JP | 5-287082 | 11/1993 |
| JP | 7-58132 | 3/1995 |
| JP | 9-046566 | 2/1997 |
| JP | 09-063993 | 3/1997 |
| JP | 10-242084 | 9/1998 |
| JP | 11-163193 | 6/1999 |
| JP | 11-307624 | 11/1999 |
| JP | 2000-77478 | 3/2000 |
| JP | 2000-183025 | 6/2000 |
| JP | 2000-195987 | 7/2000 |
| JP | 2000-286283 A | 10/2000 |
| JP | 2001-068618 | 3/2001 |
| JP | 2001-077229 | 3/2001 |
| JP | 2001-127243 A | 5/2001 |
| JP | 2001-185519 | 7/2001 |
| JP | 2001-189414 A | 7/2001 |
| JP | 2001-210667 | 8/2001 |
| JP | 2002-083785 | 3/2002 |

| | | |
|---|---|---|
| JP | 2002-093942 | 3/2002 |
| JP | 2002-94082 A | 3/2002 |
| JP | 2002-512436 | 4/2002 |
| JP | 2002-231918 | 8/2002 |
| JP | 2002-270676 | 9/2002 |
| JP | 2002-329849 | 11/2002 |
| JP | 2003-7898 | 1/2003 |
| JP | 2003-116066 | 4/2003 |
| JP | 2005-191550 | 7/2005 |
| KR | 10-0410812 | 12/2003 |
| WO | WO-99/36958 | 7/1999 |
| WO | WO-99/40624 | 8/1999 |
| WO | WO 02/50875 | 6/2002 |
| WO | WO 02/51217 | 6/2002 |

OTHER PUBLICATIONS

A. Badihi (1999) "Shellcase Ultrathin Chip Size Package," Proceedings International Symposium on Advanced Packaging Materials Processes, Properties and Interfaces, pp. 236-240.
Noma, Takashi et al., U.S Office Action mailed Jul. 11, 2008, directed at U.S. Appl. No. 90/008,219; 17 pages.
Noma, Takashi et al., U.S Office Action mailed Feb. 26, 2009, directed at U.S. Appl. No. 12/133,171; 7 pages.
Noma, Takashi et al., U.S Office Action mailed Mar. 28, 2005, directed at U.S. Appl. No. 10/696,581; 10 pages.
Noma, Takashi et al., U.S Office Action mailed Apr. 16, 2008, directed at U.S. Appl. No. 10/876,532; 7 pages.
Noma, Takashi et al., U.S Office Action mailed Jul. 27, 2005, directed at U.S. Appl. No. 10/876,532; 6 pages.
Noma, Takashi et al., U.S Office Action mailed Mar. 15, 2006, directed at U.S. Appl. No. 10/876,532; 9 pages.
Noma, Takashi et al., U.S Office Action mailed Sep. 5, 2006, directed at U.S. Appl. No. 10/876,532; 7 pages.
Noma, Takashi et al., U.S Office Action mailed Mar. 5, 2007, directed at U.S. Appl. No. 10/876,532; 7 pages.
Noma, Takashi et al., U.S Office Action mailed Nov. 14, 2008, directed at U.S. Appl. No. 10/876,532; 9 pages.
Noma, Takashi et al., U.S Office Action mailed May 26, 2009, directed at U.S. Appl. No. 10/876,532; 11 pages.
Noma, Takashi et al., U.S Office Action mailed Nov. 20, 2006, directed at U.S. Appl. No. 11/206,146;9 pages.
Noma, Takashi et al., U.S Office Action mailed on May 1, 2007, directed at U.S. Appl. No. 11/206,146;5 pages.
Noma, Takashi et al., U.S Office Action mailed Apr. 28, 2009, directed at U.S. Appl. No. 11/645,811; 9 pages.
Noma, Takashi et al., U.S Office Action mailed Apr. 16, 2009, directed at U.S. Appl. No. 11/956,160;24 pages.
Noma, Takashi et al., U.S Office Action mailed Oct. 16, 2008, directed at U.S. Appl. No. 11/956,160; 31pages.
Noma, Takashi et al., U.S Office Action mailed Dec. 9, 2004, directed at U.S. Appl. No. 10/420,943; 8 pages.
Noma, Takashi et al., U.S Office Action mailed Aug. 1, 2006, directed at U.S. Appl. No. 10/420,943; 8 pages.
Noma, Takashi et al., U.S Office Action mailed Feb. 2, 2007, directed at U.S. Appl. No. 10/420,943; 9 pages.
Noma, Takashi et al., U.S Office Action mailed Aug. 27, 2007, directed at U.S. Appl. No. 11/035,399; 7 pages.
Noma, Takashi et al., U.S Office Action mailed Mar. 7, 2007, directed at U.S. Appl. No. 11/035,399; 6 pages.
Noma, Takashi et al., U.S Office Action mailed Apr. 12, 2007, directed at U.S. Appl. No. 10/910,805; 7 pages.
Noma, Takashi et al., U.S Office Action mailed Oct. 11, 2006, directed at U.S. Appl. No. 10/910,805; 8 pages.
Noma, Takashi et al., U.S Office Action mailed Apr. 2, 2004, directed at U.S. Appl. No. 10/462,829; 8 pages.
Noma, Takashi et al., U.S Office Action mailed Jul. 21, 2006, directed at U.S. Appl. No. 10/733,799; 7 pages.
Noma, Takashi et al., U.S Office Action mailed Nov. 8, 2005, directed at U.S. Appl. No. 10/733,799; 5 pages.
Noma, Takashi et al., U.S Office Action mailed Jun. 9, 2005, directed at U.S. Appl. No. 10/733,799; 7 pages.
European Search Report, dated Apr. 3, 2009 directed to related application No. EP 04 01 8715; 3 pages.
European Search Report, dated Sep. 12, 2003, directed to EP-03010938; (4 pages).
European Office Action, dated Sep. 20, 2004, directed to EP Application No. 03013839.0; (5 pages).
European Office Action, dated Aug. 10, 2005, directed to EP Application No. 030109388.3; (15 pages).
European Office Action, dated Sep. 26, 2005, directed to EP Application No. 03013839.0; (3 pages).
European Office Action, dated Apr. 10, 2006, directed to EP Application No. 0301938.3; (4 pages).
European Search Report, dated Jul. 21, 2009, directed to EP Application No. 06026978.4; (4 pages).
Noma et al., U.S. Office Action mailed Aug. 12, 2009, directed to U.S. Appl. No. 11/956,160; (13 pages).
Kameyama, K., et al., U.S. Office Action mailed on Oct. 14, 2009, directed to U.S. Appl. No. 11/645,811; 8 pages.
Noma, T. et al., U.S. Office Action mailed on Oct. 27, 2009, directed to U.S. Appl. No. 12/133,171; 6 pages.
Extended EP Search Report dated Sep. 24, 2009, directed to EP Patent Application No. 06026978.4; 15 pages.

* cited by examiner

MANUFACTURING METHOD OF SEMICONDUCTOR DEVICE

REFERENCE TO RELATED APPLICATION

This application is a continuation in part of Ser. No. 10/696,581, filed Oct. 30, 2003, now U.S. Pat. No. 7,101,735.

BACKGROUND OF THE INVENTION

1. Field of the Invention

This invention relates to a manufacturing method of a semiconductor device which has ball-shaped conductive terminals.

2. Description of the Related Art

A CSP (Chip Size Package) receives attention in recent years as a three-dimensional mounting technology as well as a new packaging technology. The CSP means a small package having about the same outside dimensions as those of a semiconductor die packaged in it.

A BGA (Ball Grid Array) type semiconductor device has been known as a kind of CSP. A plurality of ball-shaped conductive terminals made of metal such as solder is arrayed in a grid pattern on one principal surface of a package of the BGA type semiconductor device and is electrically connected with the semiconductor die mounted on the other side of the package.

When the BGA type semiconductor device is mounted into electronic equipment, the semiconductor die and external circuit on a printed circuit board are electrically connected by compression bonding of each of the conductive terminals to each of wiring patterns on the printed circuit board.

Such a BGA type semiconductor device has advantages in providing a large number of conductive terminals and in size reduction over other CSP type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example.

FIGS. 11A and 11B show outline structure of a conventional BGA type semiconductor device. FIG. 11A is an oblique perspective figure showing a top side of the BGA type semiconductor device. And FIG. 11B is an oblique perspective figure showing a back side of the BGA type semiconductor device.

A semiconductor die 104 is sealed between a first glass substrate 102 and a second glass substrate 103 through epoxy resins 105a and 105b in the BGA type semiconductor device 101. A plurality of conductive terminals 106 is arrayed in a grid pattern on a principal surface of the second glass substrate 103, that is, on a back surface of the BGA type semiconductor device 101. The conductive terminals 106 are connected to the semiconductor die 104 through a plurality of second wirings 110. The plurality of second wirings 110 is connected with aluminum first wirings pulled out from inside of the semiconductor die 104, making each of the conductive terminals 106 electrically connected with the semiconductor die 104.

More detailed explanation on a cross-sectional structure of the BGA type semiconductor device 101 will be given hereafter referring to FIG. 12. FIG. 12 shows a cross-sectional view of the BGA type semiconductor devices 101 divided along dicing lines into individual dice.

The first wiring 107 is provided on an insulation film 108 on a top surface of the semiconductor die 104. The semiconductor die 104 is bonded to the first glass substrate 102 with the resin 105a. A back surface of the semiconductor die 104 is bonded to the second glass substrate 103 with the resin 105b.

One end of the first wiring 107 is connected to the second wiring 110. The second wiring 110 extends from the end of the first wiring 107 to a surface of the second glass substrate 103. The ball-shaped conductive terminal 106 is formed on the second wiring 110 extended onto the second glass substrate 103.

A protection film 111 of an organic resin is formed before dicing on a top surface of the BGA type semiconductor device 101 described above, which has a V-shaped groove VG (Refer to FIG. 13A.). Conventionally, the protection film 111 is formed on a surface of the second wiring 110 by facing up the back surface of the semiconductor die 104, potting a thermosetting organic resin on it and spinning a semiconductor wafer, in which the semiconductor dice 104 are formed, to spread the thermosetting organic resin on the back surface utilizing centrifugal force.

In this method, however, the thermosetting organic resin accumulates too thick in a bottom of the V-shaped groove VG around the dicing line (dashed line), as shown in FIG. 13A. It is because the thermosetting organic resin has a property of a sticky paste. As a result, the organic resin accumulated in the bottom of the V-shaped groove VG shrinks more than the organic resin covering other portion of the semiconductor device 101, when the protection film 111 is hardened by baking (heat treatment). There arises a problem that the larger shrinking in the bottom of the V-shaped groove VG causes a warping in the semiconductor wafer. (The warping in direction indicated by arrows in FIG. 13B is caused.)

The warping in the semiconductor wafer poses a problem to a manufacturing process that follows. Especially in a process step to form the conductive terminal 106 by screen printing using the protection film 111 as a mask, accuracy of printing alignment gets worse, resulting in reduced yield or potential deterioration in reliability of the BGA type semiconductor device 101.

SUMMARY OF THE INVENTION

The invention provides a method of manufacturing a semiconductor device. The method includes providing a semiconductor wafer having a first wiring formed on its front surface, bonding a supporting substrate to the front surface of the semiconductor wafer, etching the semiconductor wafer to expose a portion of the first wiring, forming a second wiring connected with the exposed portion of the first wiring and extending over the back surface of the semiconductor wafer, and forming a protection film on the second wiring by spray coating.

The invention also provides another method of manufacturing a semiconductor device. The method includes providing a semiconductor wafer having a first insulation film formed on its front surface and a first wiring formed on the first insulation film, bonding a supporting substrate to the front surface of the semiconductor wafer, etching the semiconductor wafer to expose a portion of the first insulation film, forming a second insulation film to cover a back surface of the semiconductor wafer and the exposed portion of the first insulation film, etching the first and second insulation films to expose a portion of the first wiring, forming a second wiring connected with the exposed portion of the first wiring and extending over the second insulation film, and forming a protection film on the second wiring by spray coating.

The invention further provides a method of manufacturing a semiconductor device. The method includes providing a semiconductor wafer comprising a first wiring formed on its front surface, bonding a supporting substrate to the front surface of the semiconductor wafer, etching the semiconductor wafer to expose a portion of the first wiring, forming a second wiring connected with the exposed portion of the first wiring and extending over the back surface of the semiconductor wafer, forming a first protection film on the second wiring by spin coating, and forming a second protection film on the second wiring by spray coating.

DETAILED DESCRIPTION OF THE INVENTION

A manufacturing method of a semiconductor device according to an embodiment of this invention will be explained referring to figures hereinafter. FIGS. 1-6 are cross-sectional views showing the manufacturing method of the semiconductor device according the embodiment of this invention.

Figure 1:
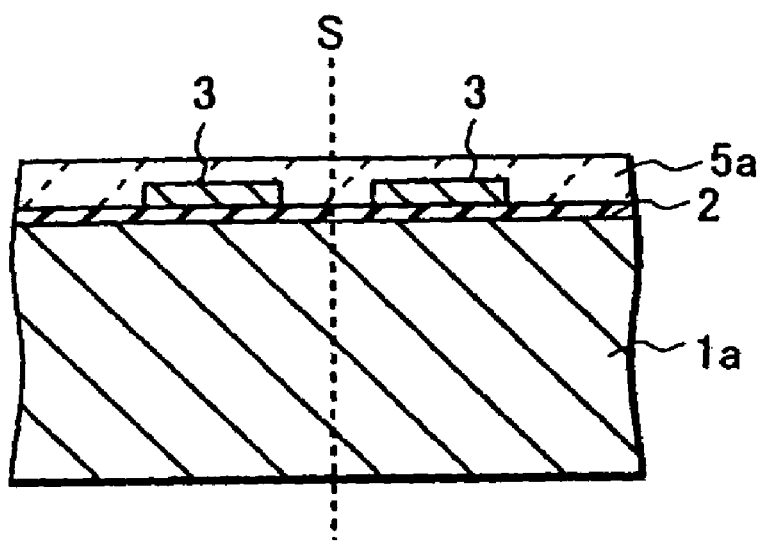
FIG. 1 is a cross-sectional view showing a manufacturing method of a semiconductor device according an embodiment of this invention.

First, a semiconductor wafer 1a having a plurality of semiconductor dice 1 is provided, as shown in FIG. 1. The semiconductor dice 1 are CCD image sensors, for example, and are manufactured by semiconductor wafer processing. A pair of first wirings 3 made mainly of aluminum or copper are formed to be 1 µm thick by sputtering on a insulation film 2 formed on the semiconductor wafer 1a.

Each of the pair of first wirings 3 is formed facing each other across a border line (called a dicing line or a scribe line) S to divide the semiconductor wafer into individual dice. Or, a first wiring 3 may be formed extending across the border line S and divided into a pair of first wirings 3 later on.

Each of the pair of first wirings 3 makes a pad extending from a bonding pad in the semiconductor die 1 to proximity of the border line S. That is, each of the pair of first wirings 3 is a pad for external connection, and is electrically connected with a circuit in the semiconductor die 1 which is not shown in the figure.

Figure 2:
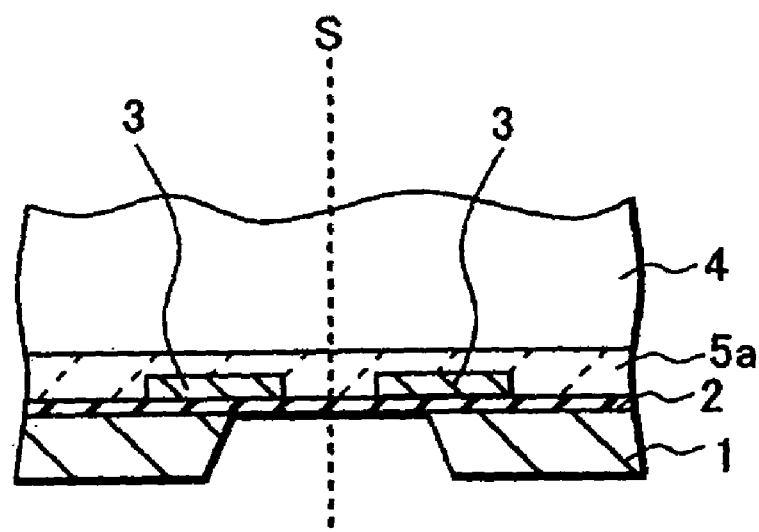
FIG. 2 is a cross-sectional view showing the manufacturing method of the semiconductor device according the embodiment of this invention.

Next, a first glass substrate 4 of thickness of 200 µm is bonded to a top surface of the semiconductor wafer 1a, on which the first wirings 3 have been formed, using a resin 5a made of transparent epoxy material as a binder, as shown in FIG. 2. Then the semiconductor wafer 1a is etched along the border line S from its back surface by dry etching to expose the insulation film 2, after the semiconductor wafer 1a is back-ground to 100 µm in thickness. Although the semiconductor wafer 1a is divided into individual dice 1 by the dry etching, the semiconductor dice 1 are held together with the first glass substrate 4 working as a supporting substrate to keep a shape of a sheet of the semiconductor wafer 1a.

Figure 3:
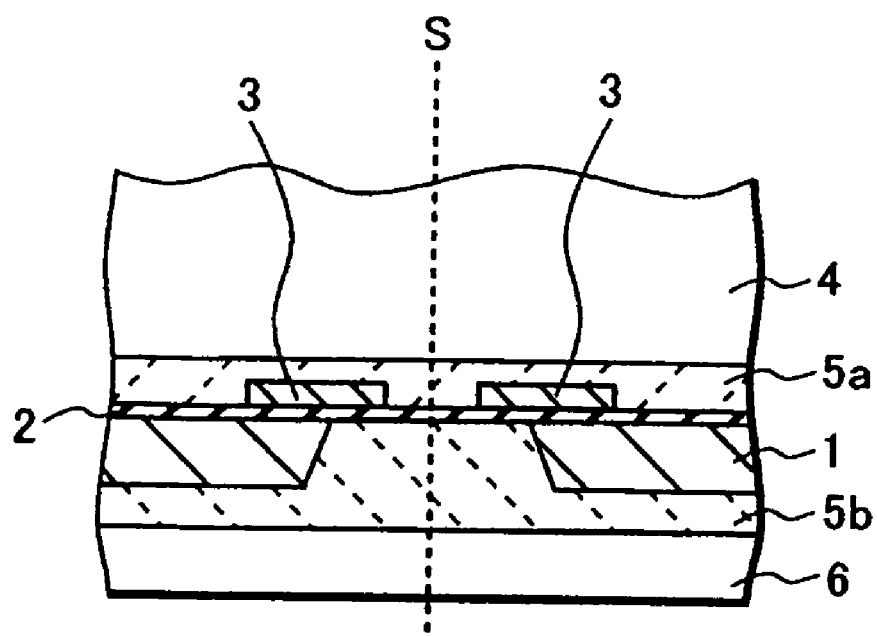
FIG. 3 is a cross-sectional view showing the manufacturing method of the semiconductor device according the embodiment of this invention.

Then another supporting substrate of a second glass substrate 6 of 100 µm in thickness is bonded to the back surface of the semiconductor dice 1 using a resin 5b as a binder, as shown in FIG. 3.

Figure 4A:
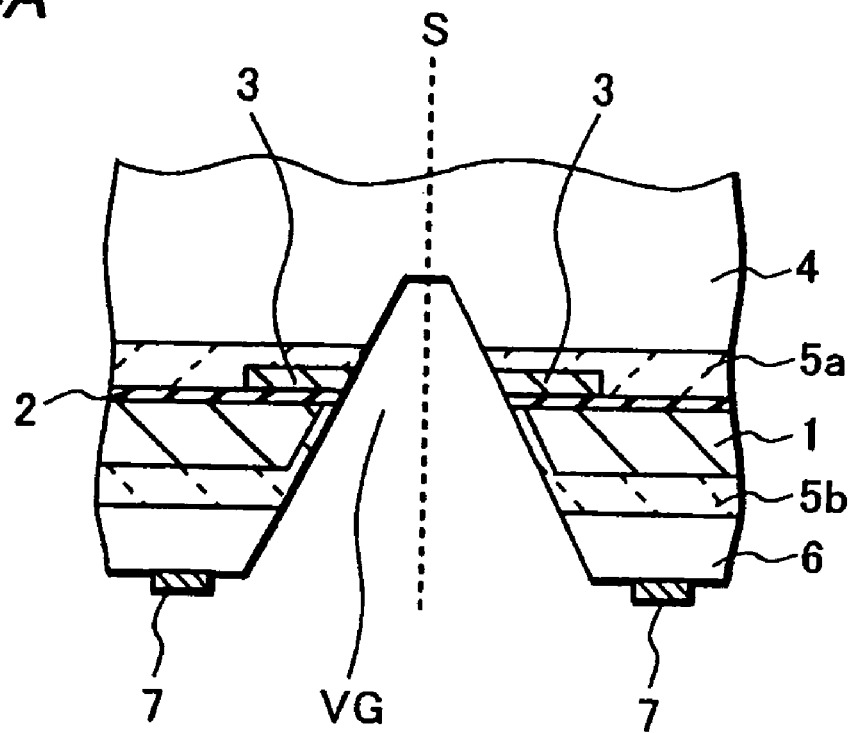
FIGS. 4A and 4B are cross-sectional views showing the manufacturing method of the semiconductor device according the embodiment of this invention.

After that, a cushioning material 7 made of flexible photosensitive organic film is preferably formed on a flat portion at predetermined position on each of the second glass substrates 6, as shown in FIG. 4A. The cushioning material 7 is to absorb a stress applied on a conductive terminal 10, which will be described later, and prevent the glass substrate from cracking. Note that the cushioning material 7 may be made of a material other than the photosensitive organic film, as long as it is flexible.

The cushioning material 7 is formed on the surface of the second glass substrate 6 by coating by spraying (hereafter referred to as spray coating) a film-forming material such as liquid photosensitive organic material toward the surface of the second glass substrate 6 with a spray coater (not shown).

The spray coater is structured to apply pressure on the liquid photosensitive organic material and spray it from a thin nozzle on the surface of the second glass substrate 6, making the photosensitive organic material mist of fine particles. The spray coater may be controlled manually or automatically, as long as it is structured as described above.

Then unwanted portion (portion except for portions at the predetermined positions) of the cushioning material 7 formed on the second glass substrate 6 is removed.

The cushioning material 7 is formed in uniform thickness by the spray coating. Therewith the conductive terminal 10 can be formed at a predetermined position and of a predetermined height, when the conductive terminal 10 is formed above the cushioning material 7 later on. As a result, the stress applied on the conductive terminal 10 is made uniform, preventing cracking and warping of the glass substrate due to the stress from occurring.

After that, notching is made from the back surface of the semiconductor die 1 along the border line S. The notching is made by cutting the semiconductor die 1 from its back surface using a saw-shaped tool such as a blade, for example. The notching is made from the second glass substrate 6 until a part of the first glass substrate 4 is cut so that side edges of the first wirings 3 are exposed on the notched surface. A V-shaped groove VG is formed along the border line S by the notching. Since the exposed surface is contaminated by the notching in some cases, the exposed surface may be cleaned by dry etching if necessary.

The notching is made after forming the cushioning material 7 in the embodiment described above. Not limited to that, the cushioning material 7 may be formed after the notching process by spray coating. Since the cushioning material 7 is formed uniform in thickness over the surface including the surface of the V-shaped groove VG without accumulating thick in a bottom of the V-shaped groove VG, consumption of the photosensitive organic material is reduced as much as possible in this case also. Besides, the semiconductor wafer 1a is prevented from warping, because the photosensitive organic material is formed uniform in thickness without becoming thick in the bottom of the V-shaped groove VG.

Figure 4B:
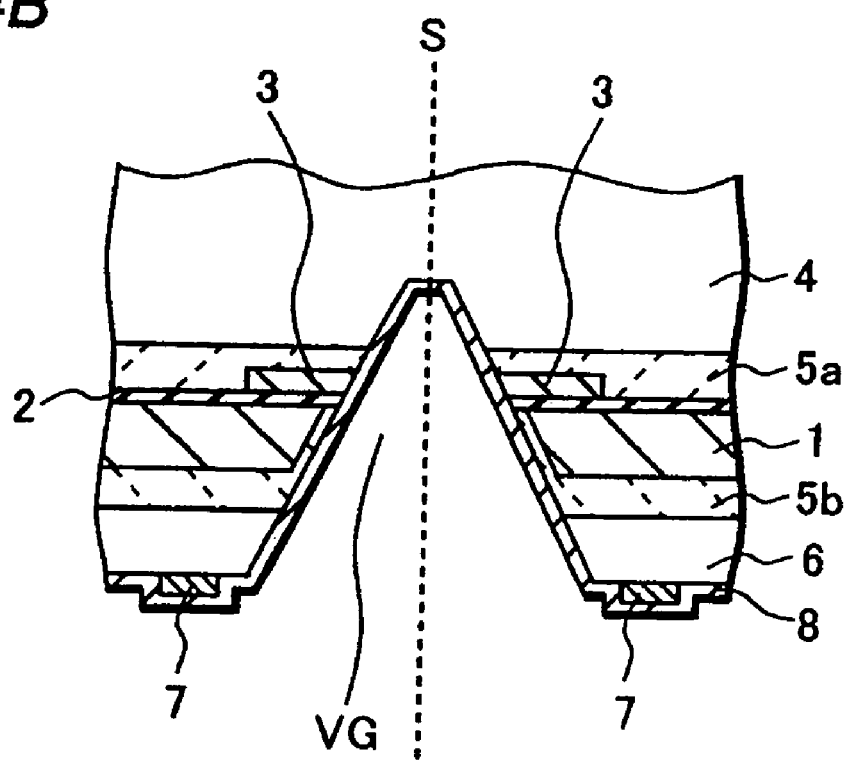

Next, a metal layer of thickness of about 3 μm made mainly of aluminum or copper is formed to cover the second glass substrate 6 and the V-shaped groove VG formed by the notching, as shown in FIG. 4B. Then, patterning is made on the metal layer 8 to form a second wiring 8 which is electrically connected with the exposed side edge of the first wiring 3. Ni (nickel) and Au (gold) plating (not shown) is formed on the surface after the second wiring 8 is formed. The second wiring 8 extends over the surface of the second glass substrate 6 on the back surface of the semiconductor die 1. The conductive terminal 10, which will be described later, is formed on the second wiring 8 extended over the surface of the second glass substrate 6.

Figure 5:
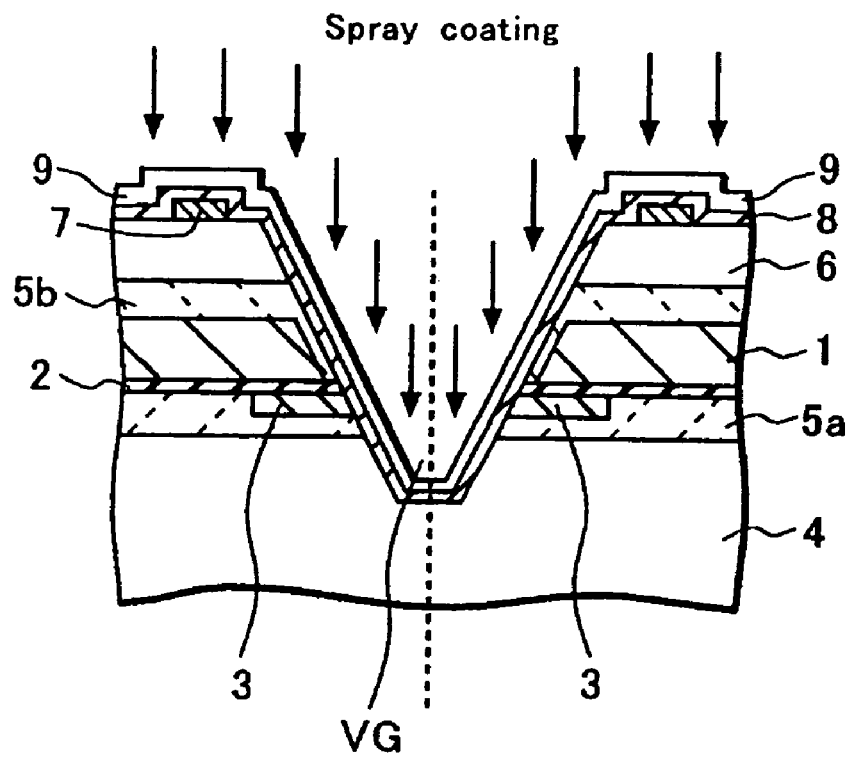
FIG. 5 is a cross-sectional view showing the manufacturing method of the semiconductor device according the embodiment of this invention.

Next, a protection film 9 is formed on the second wiring 8, as shown in FIG. 5. The protection film 9 works as a solder mask in later process step of screen printing. The protection film 9 is formed on the surface of the second wiring 8 by spray coating an organic resin such as an epoxy resin, for example, with a spray coater (not shown) in direction indicated with arrows in the figure, that is, toward the surface of the second wiring 8.

The spray coater is structured to apply pressure on the liquid organic resin and spray it from a thin nozzle on the surface of the second wiring 8, making the organic resin mist of fine particles. The spray coater may be controlled manually or automatically, as long as it is structured as described above.

Since the protection film 9 is formed to have uniform thickness on the surface including the V-shaped groove VG without becoming a thick pile in the bottom of the V-shaped groove VG, consumption of the organic resin is reduced as much as possible.

When a thermosetting resin is used as the organic resin, the protection film 9 is hardened by baking at predetermined temperature after spray coating the protection film 9. Unlike in the case of the conventional art, warping of the semiconductor wafer 1a does not occur in this case, since the protection film 9 is formed to have uniform thickness without becoming thick in the bottom of the V-shaped groove VG The protection film 9 may be formed of a photoresist material.

Next, an opening K is formed at predetermined position in the protection film 9 above the second glass substrate 6 to expose the second wiring 8, so that the conductive terminal 10, which will be described later, is formed in the opening K. The opening K is formed above the cushioning material 7, when the cushioning material 7 is provided. The opening K is formed using a photoresist layer R as described below.

Figure 6:
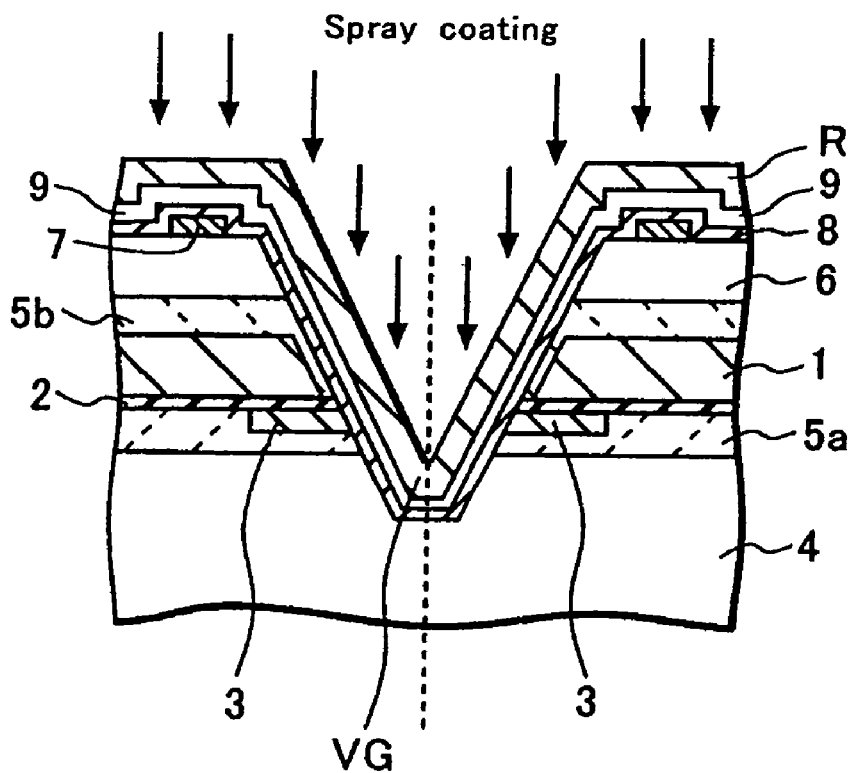
FIG. 6 is a cross-sectional view showing the manufacturing method of the semiconductor device according the embodiment of this invention.

As shown in FIG. 6, the photoresist layer R is formed on the protection film 9 by spray coating a liquid photoresist material, for example, in direction as indicated with arrows in the figure, that is, toward a surface of the protection film 9. Forming the photoresist layer R by spray coating is done with a spray coater (not shown).

The spray coater is structured to apply pressure on the liquid photoresist material and spray it from a thin nozzle on the surface of the protection film 9, making the photoresist material mist of fine particles. The spray coater may be controlled manually or automatically, as long as it is structured as described above.

Since the photoresist layer R is formed to have uniform thickness on the surface including the V-shaped groove VG without becoming thick in the bottom of the V-shaped groove VG, consumption of the photoresist material is reduced as much as possible.

When a thermosetting resin is used as the photoresist material, the photoresist layer R is hardened by baking at predetermined temperature after spray coating the photoresist layer R. Unlike in the case of the conventional art, warping of the semiconductor wafer 1a does not occur in this case, since the photoresist layer R is formed to have uniform thickness without accumulating thick in the bottom of the V-shaped groove VG.

Figure 7:
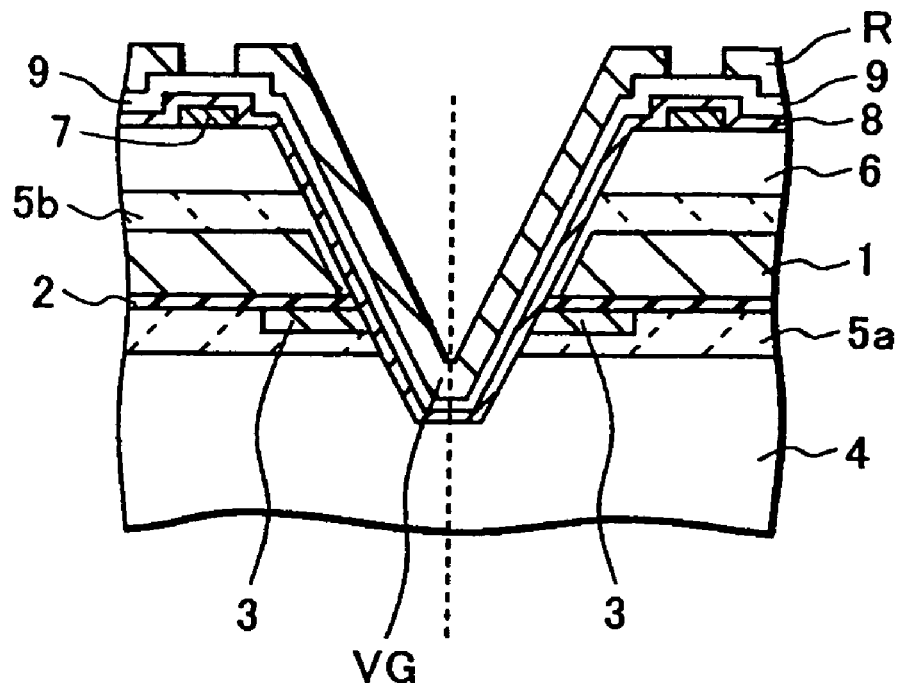
FIG. 7 is a cross-sectional view showing the manufacturing method of the semiconductor device according the embodiment of this invention.
Figure 8:
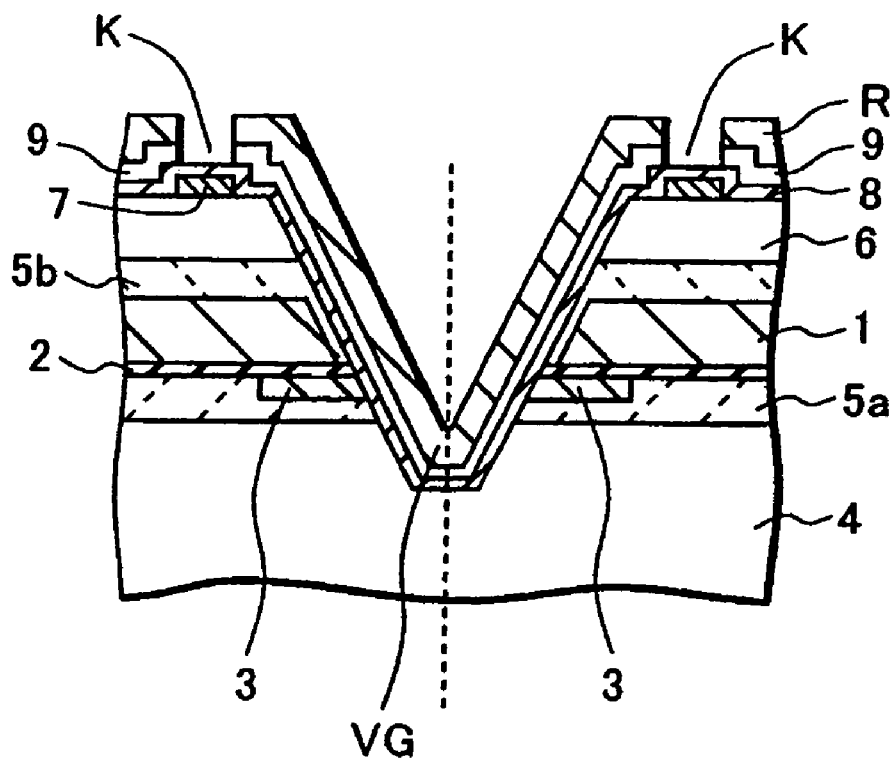
FIG. 8 is a cross-sectional view showing the manufacturing method of the semiconductor device according the embodiment of this invention.
Figure 9:
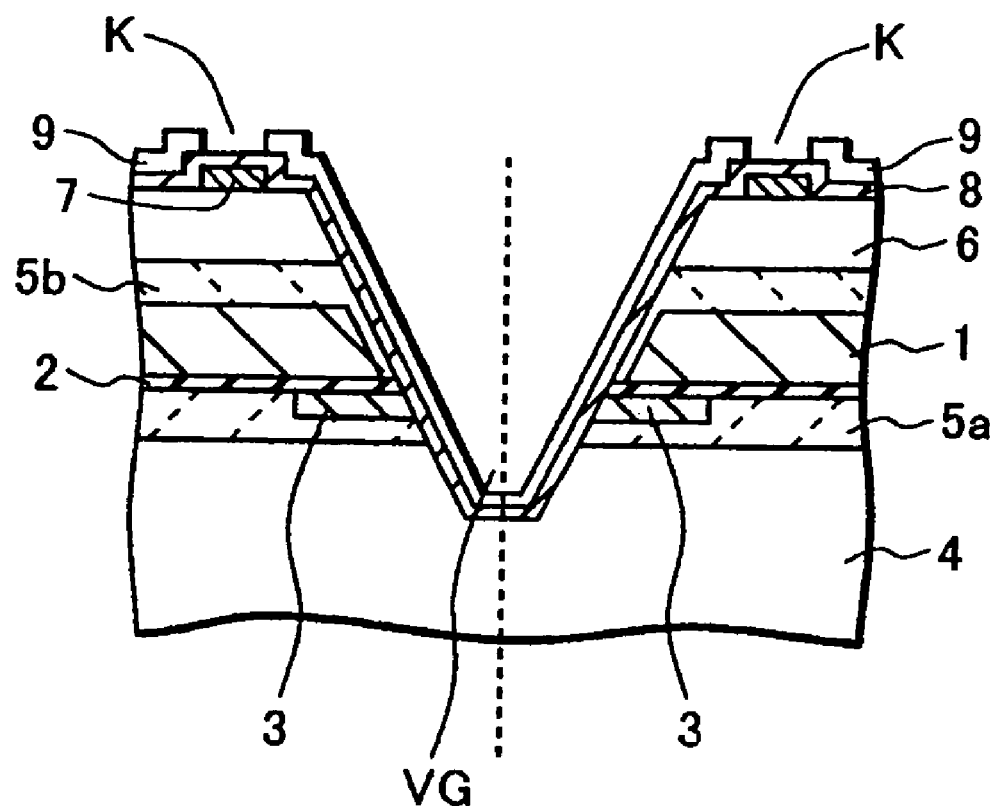
FIG. 9 is a cross-sectional view showing the manufacturing method of the semiconductor device according the embodiment of this invention.

Next, as shown in FIG. 7, portions of the photoresist layer R above the cushioning material 7 are removed by exposure using a mask (not shown) and development. Then, portions of the protection film 9 are removed by etching using the photoresist layer R as a mask, from which above-mentioned portions are removed, so that the openings K are formed to expose the second wiring 8, as shown in FIG. 8. After that, the photoresist layer R is removed, as shown in FIG. 9.

Figure 10A:
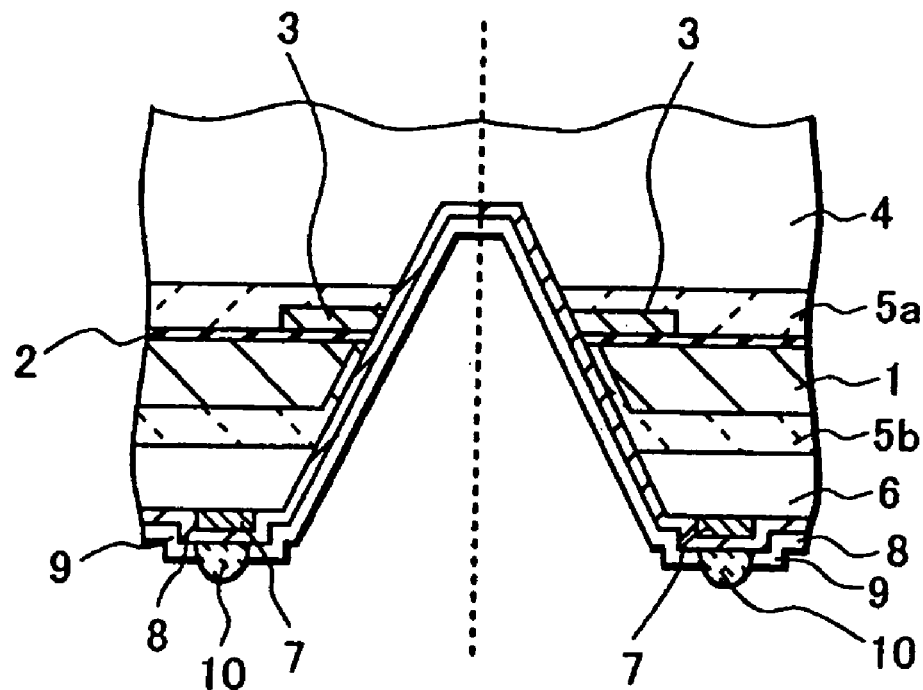
FIGS. 10A and 10B are cross-sectional views showing the manufacturing method of the semiconductor device according the embodiment of this invention.

Next, the conductive terminals 10 made of metal such as solder are formed on the second wiring 8 exposed in the openings K, by screen printing using the protection film 9 with the openings K as a mask, as shown in FIG. 10A. Each of the conductive terminals 10 is disposed above the cushioning material 7, when the cushioning material 7 is provided.

The screen printing is made with high accuracy, since the warping in the semiconductor wafer 1a is suppressed compared with the conventional art. That is, yield and reliability of the BGA type semiconductor device are improved with this embodiment by improving accuracy of processing such as the screen printing which requires flatness of the semiconductor wafer.

After that, a reflow process is performed. Therewith the conductive terminals 10 are made ball-shaped.

Figure 10B:
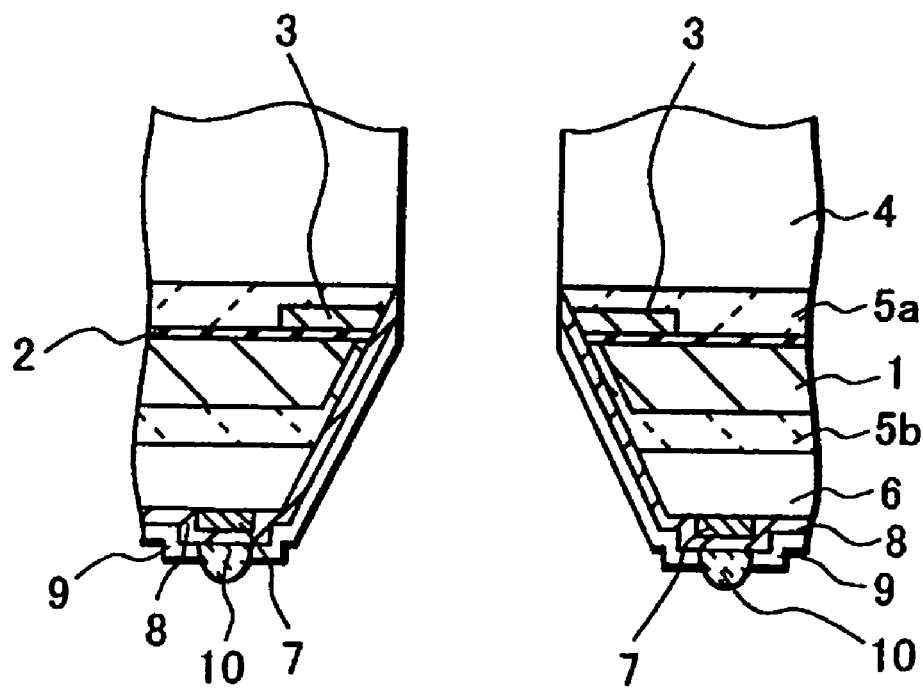
Figure 11A:
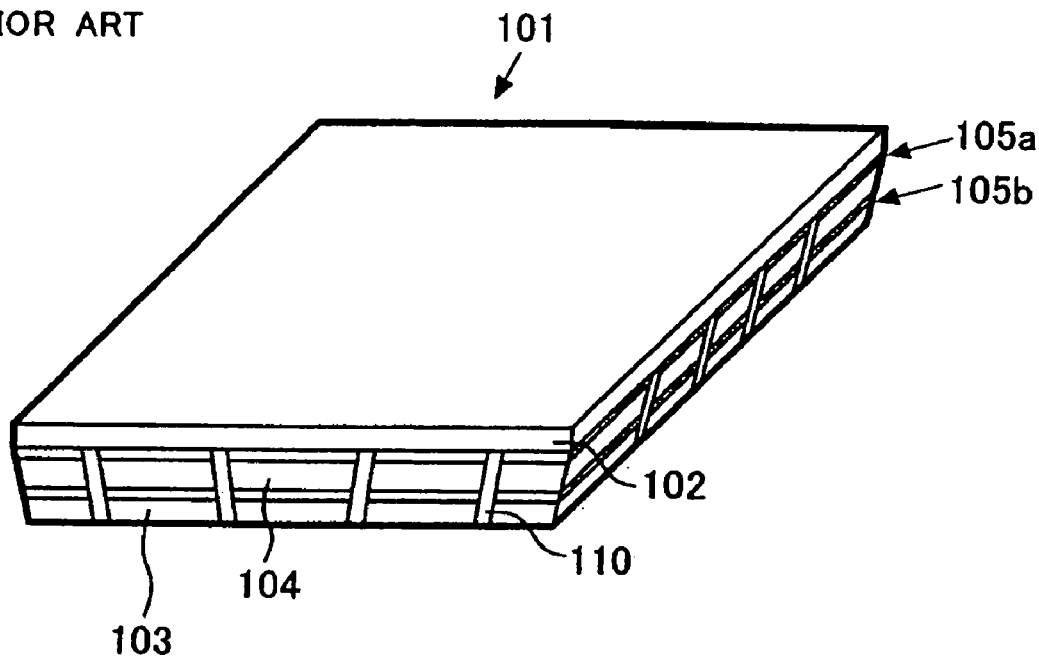
FIGS. 11A and 11B are oblique perspective views showing a manufacturing method of a semiconductor device according to a conventional art.
Figure 11B:
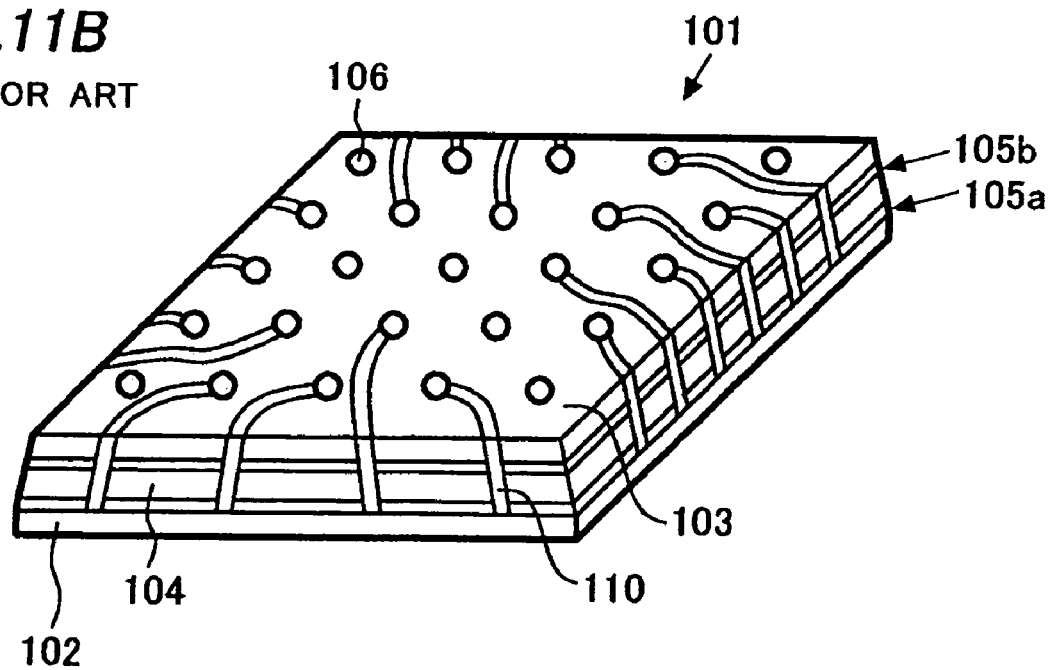
Figure 12:
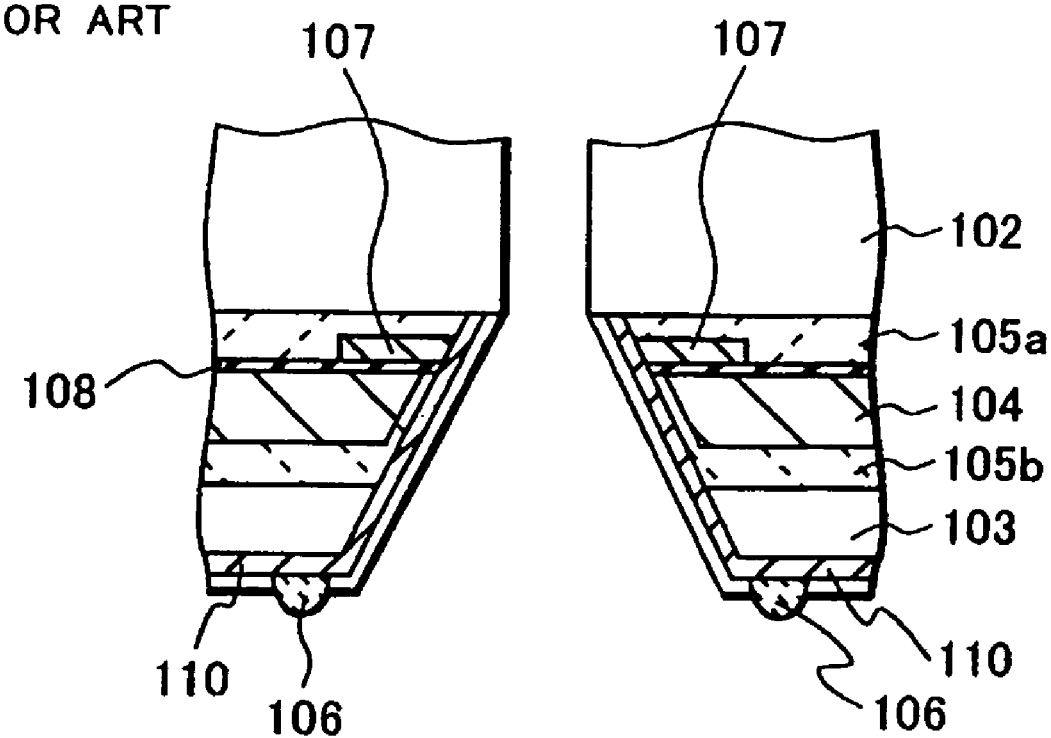
FIG. 12 is a cross-sectional view showing the manufacturing method of the semiconductor device according to the conventional art.
Figure 13A:
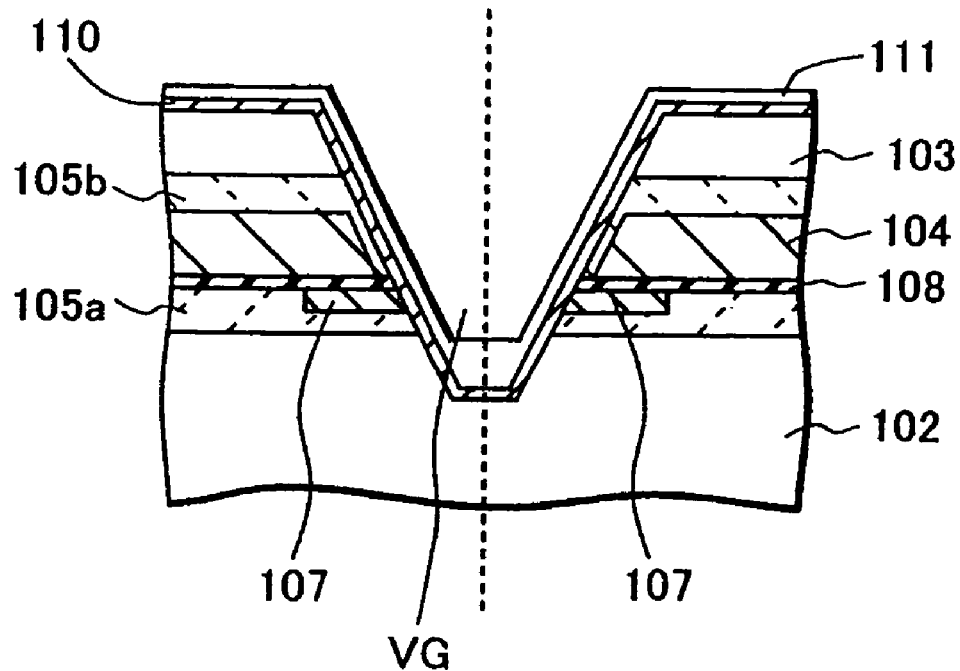
FIGS. 13A and 13B are cross-sectional views showing the manufacturing method of the semiconductor device according to the conventional art.
Figure 13B:
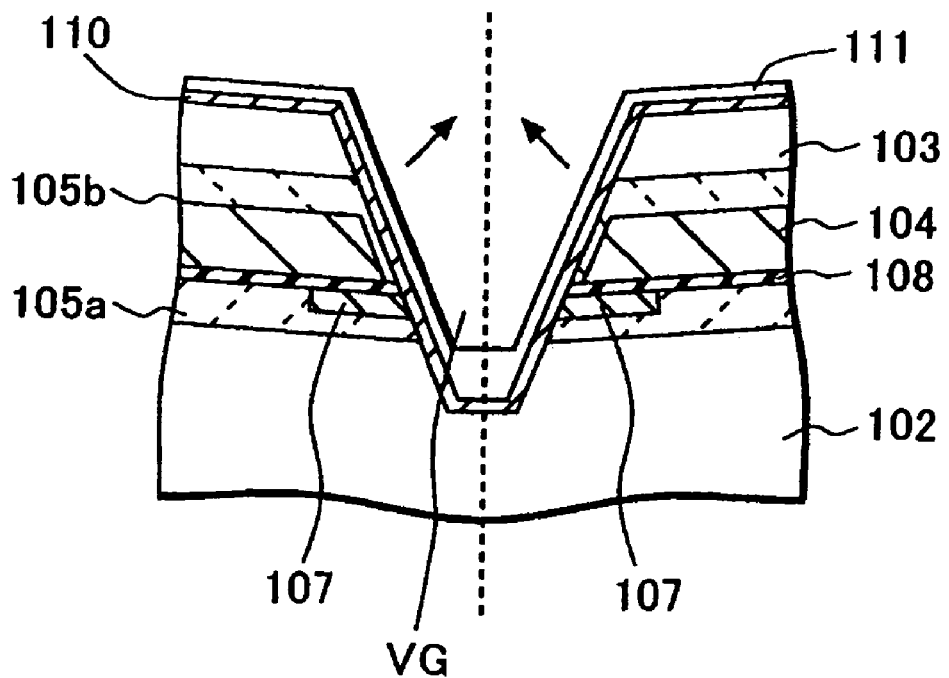

Next, the semiconductor wafer 1a is diced along the dicing lines S into individual semiconductor dice 1, as shown in FIG. 10B. With this, the BGA type semiconductor device is completed.

The photoresist layer R to form the openings K is formed on the protection film 9 by spray coating in the embodiment described above. This invention is not limited to that. That is, when a photoresist layer is used as a masking material in any other process step, the photoresist layer may be formed by spray coating.

Although the first glass substrate 4 and the second glass substrate 6 are bonded to the semiconductor wafer 1a in the embodiment to secure reliability, the second glass substrate 6 may be omitted to simplify the manufacturing process. In this case, the groove is formed by etching the semiconductor wafer 1a along the border line S from its back surface to expose the first wirings 3, after back grinding the semiconductor wafer 1a as described referring to FIG. 2. The etching is made using a photoresist layer which is formed by spray coating a photoresist material on the back surface of the semiconductor wafer 1a.

If the cushioning material 7 is to be provided on the back surface of the semiconductor die, the cushioning material 7 is formed on the back surface of the semiconductor wafer 1a by spray coating. Furthermore, the protection film 9 is formed on the second wiring 8 by spray coating, after the second wiring 8 is formed on the back surface of the semiconductor wafer 1a (semiconductor die 1).

FIGS. 14A-19B show a manufacturing method of a semiconductor device according another embodiment of this invention, which does not employ the second glass substrate 6 as explained above.

Figure 14A:
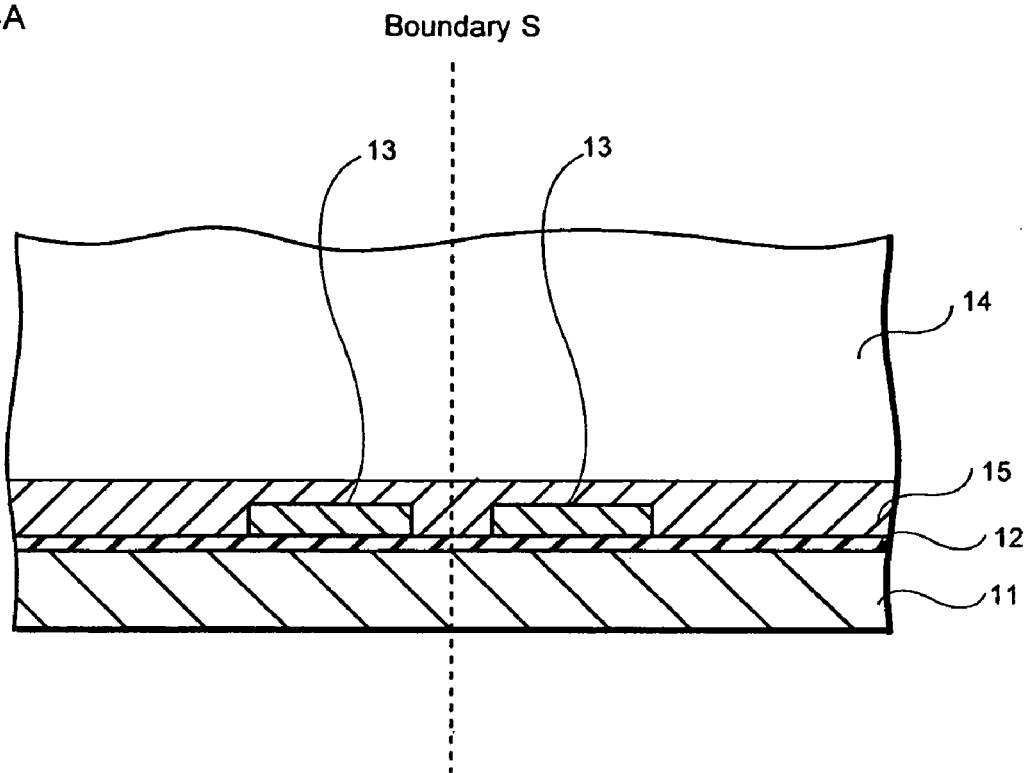
FIGS. 14A and 14B are cross-sectional views showing a manufacturing method of a semiconductor device according another embodiment of this invention.
Figure 14B:
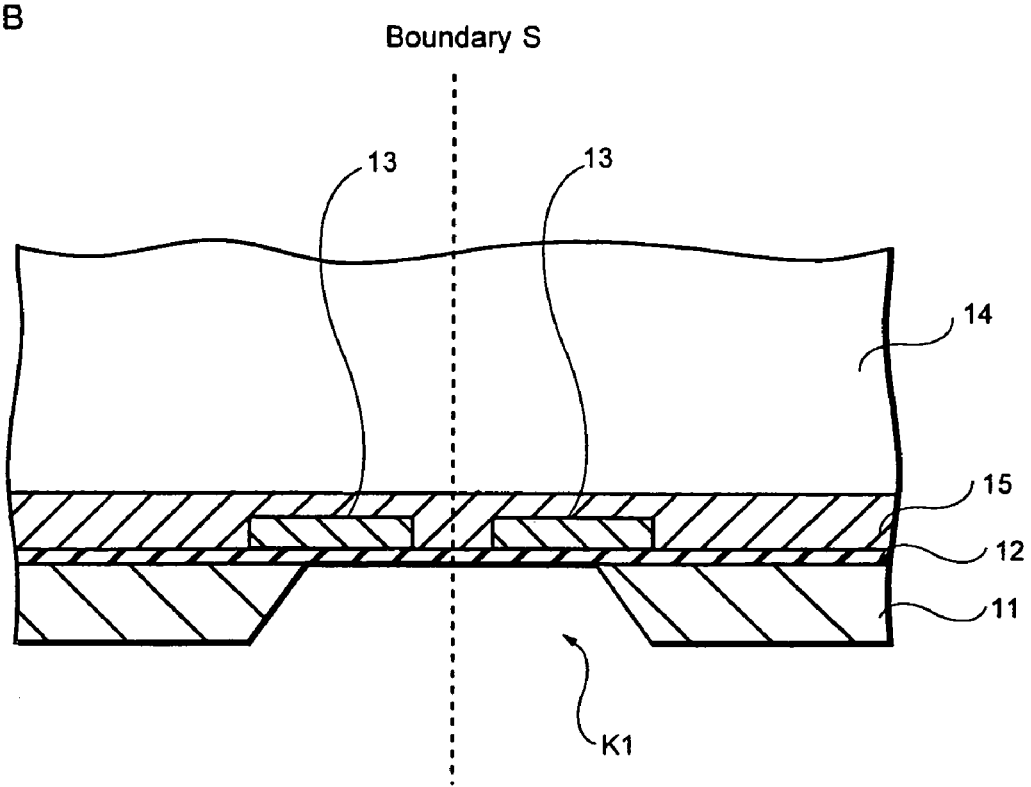

The steps shown in FIGS. 14A and 14B are essentially the same as those in FIGS. 1 and 2. Reference numerals 11, 12, 13, 14 and 15 correspond to the semiconductor wafer, the first insulation film, the first firings, the glass substrate and the resin layer, respectively. The hole K1 is formed by etching the wafer 11, either with dry etching using $SF_6$ or $C_4F_8$ or with conventional wet etching.

Figure 15A:
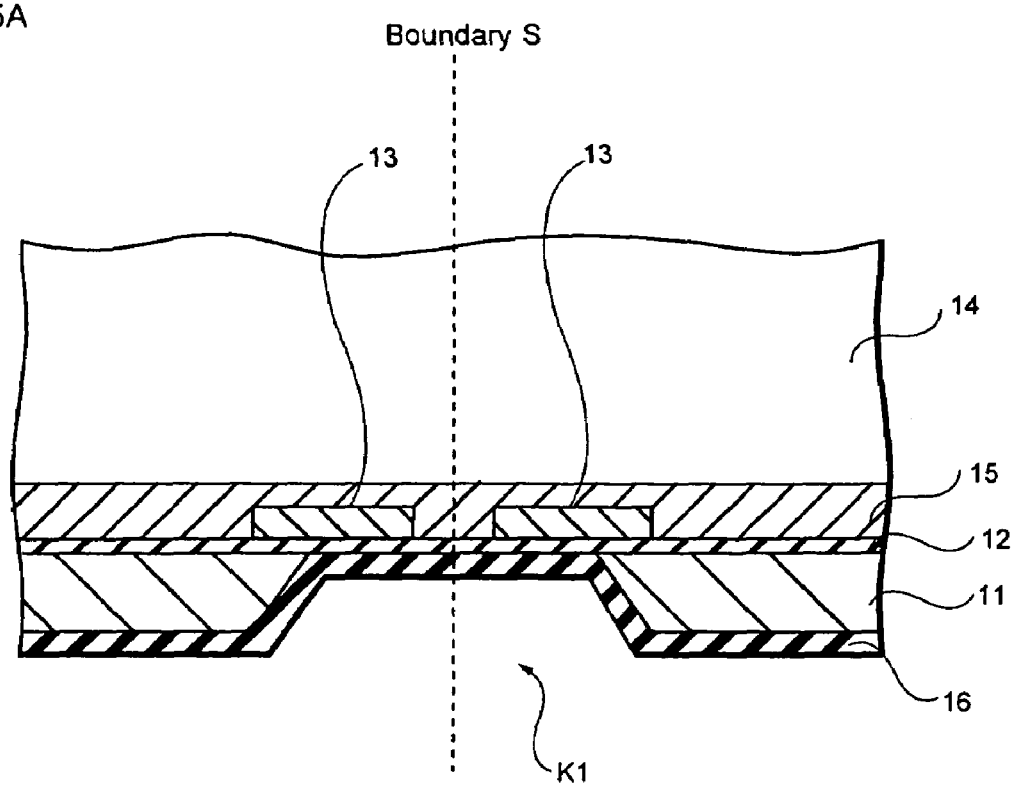
FIGS. 15A and 15B are a cross-sectional views showing the manufacturing method of the semiconductor device according the another embodiment of this invention.
Figure 15B:
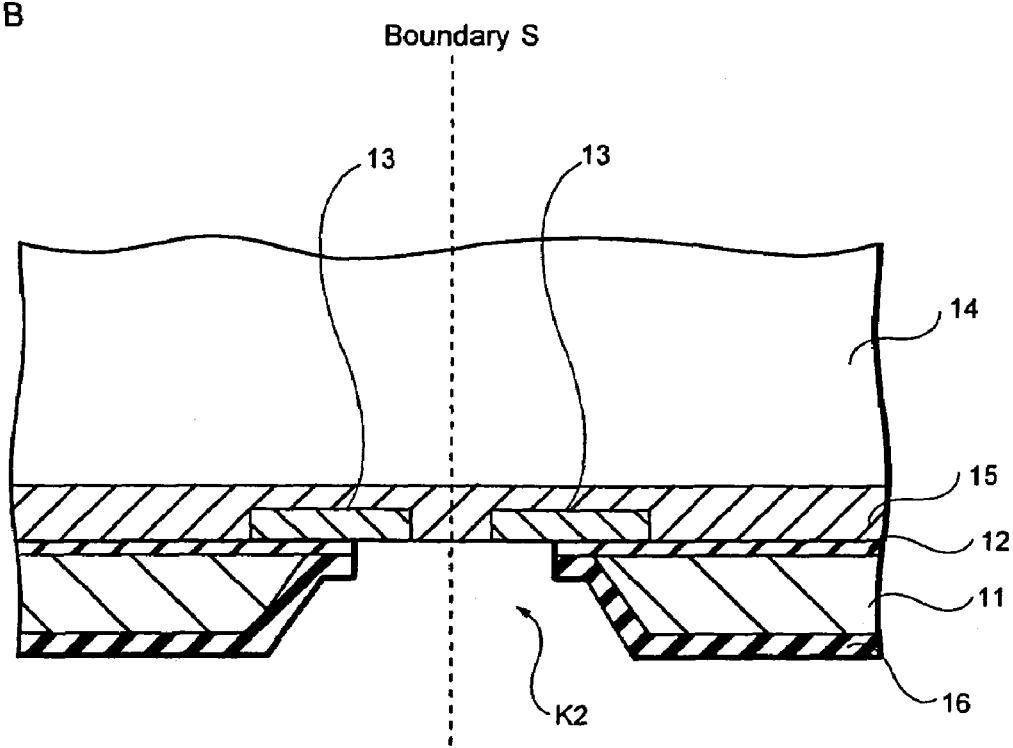

A second insulation film 16 is formed on the back surface of the wafer 11, including the bottom and the sidewall of the hole K1, as shown in FIG. 15A. In this embodiment, the second insulation film 16 is a an oxide film, or a silicon nitride film, formed by a CVD method and has a thickness of about 3 μm. A photoresist layer (not shown) is formed on the second insulation film 16 and has an opening corresponding to the first wirings 13. The first and second insulation films 12 and 16 are etched through the opening of the resist layer by conventional wet etching. A conventional dry etching may be also used in this step. As a result, the second insulation film 16 has an opening K2 where the first wirings are exposed, as shown in FIG. 15B.

Figure 16A:
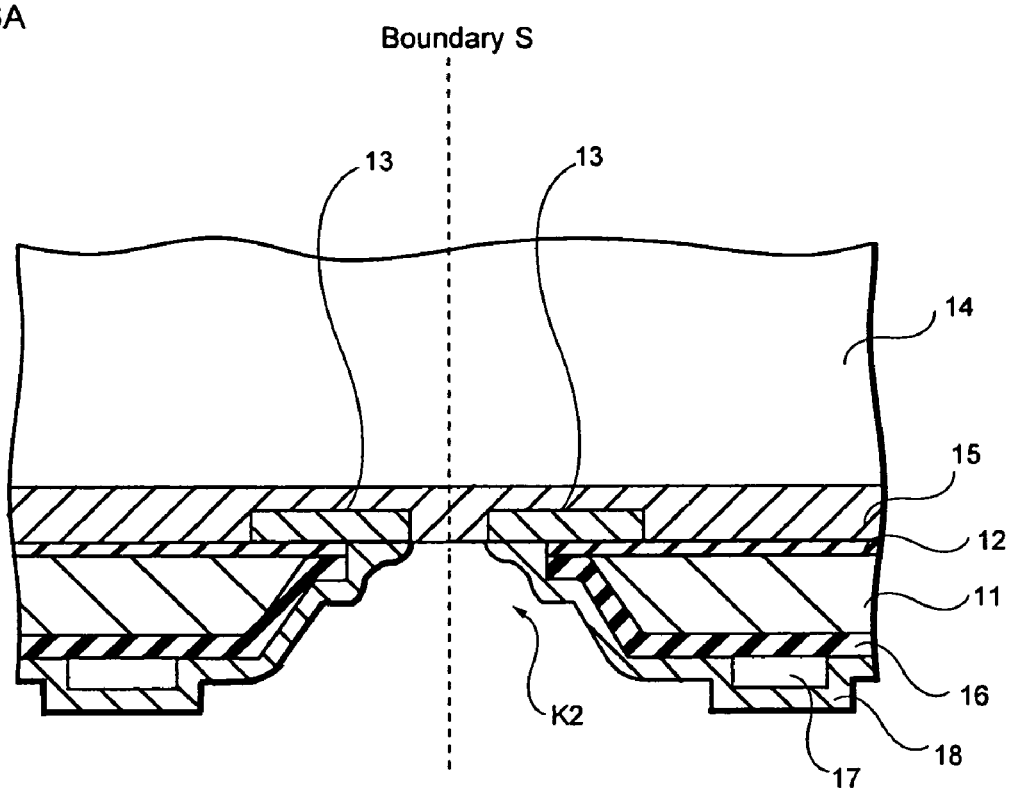
FIGS. 16A and 16B are cross-sectional views showing the manufacturing method of the semiconductor device according the another embodiment of this invention.
Figure 16B:
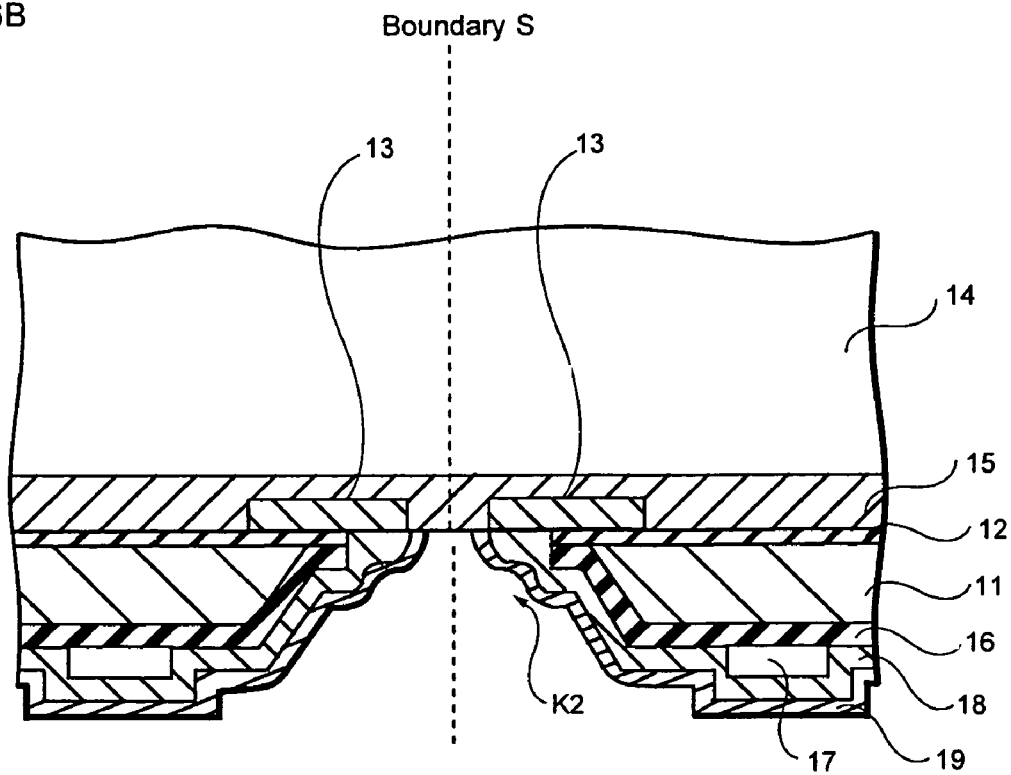

A cushioning pad 17 is formed on the second insulation film 16, for example by the spray coating described in the first embodiment. The second wiring 18 is then formed on the back surface of the wafer 11, including the cushioning pad 17, the sidewall of the hole K1 and the first wirings 13 exposed in the opening K2, as shown in FIG. 16A. It is noted that the cushioning pad 17 may not be necessary for some applications. A Ni—Au plating film 19 is formed on the second wiring 18 by electroless plating, as shown in FIG. 16B.

Figure 17A:
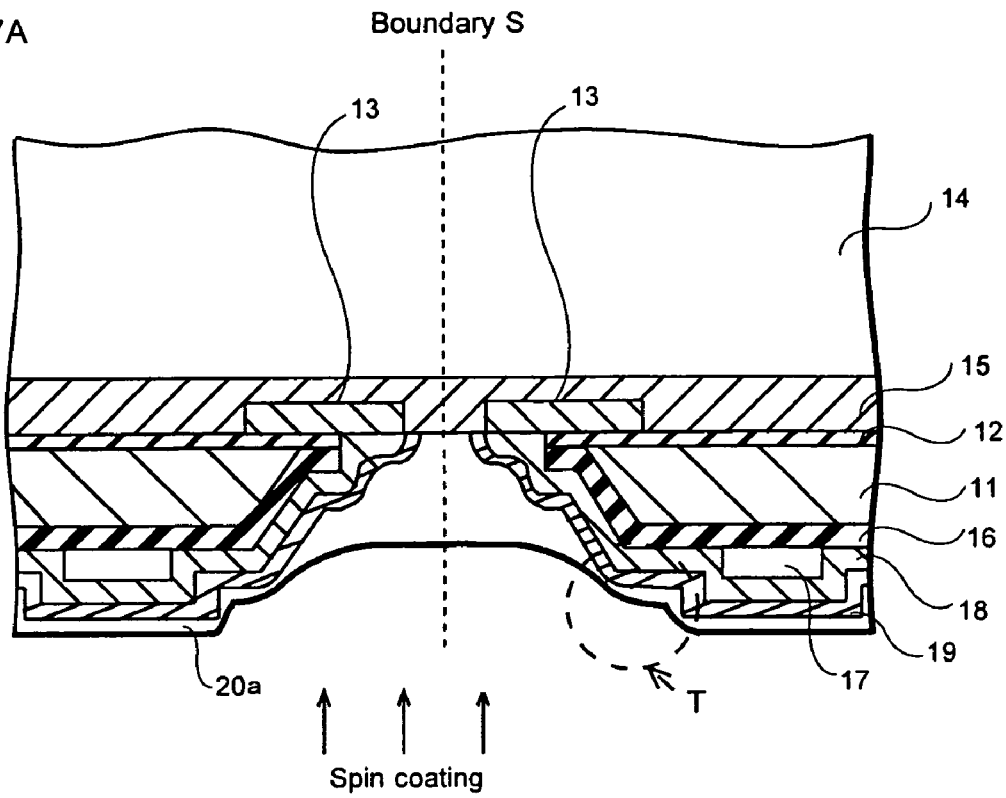
FIGS. 17A and 17B are a cross-sectional views showing the manufacturing method of the semiconductor device according the another embodiment of this invention.
Figure 17B:
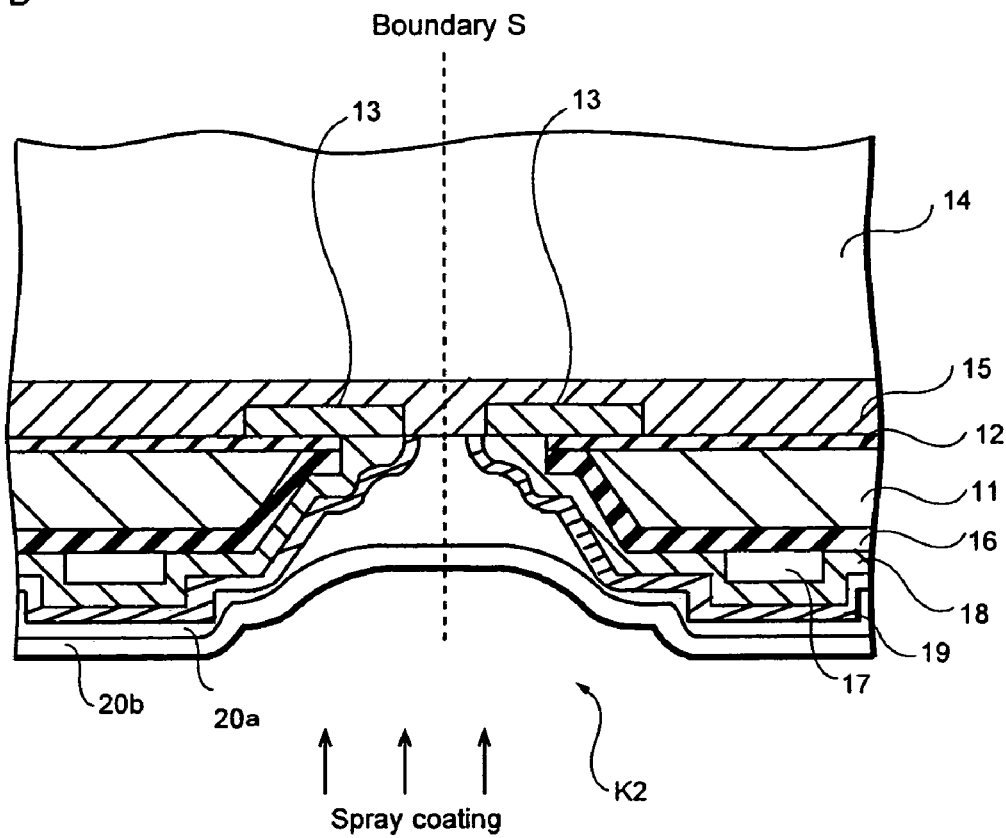

A first protection film 20a is spin coated to the back surface of the wafer 11, as shown in FIG. 17A. In this embodiment, a photoresist solution is spin coated at about 5000 rpm. It is also possible to use an organic resin solution, which is not a photoresist solution, for the coating. It was found that the first protection film 20a is thin at the upper edge of the hole K1. The thin edged is shown as T in FIG. 17A. In some cases, the edge portion of the wirings 18 and 19 in the T region breaks the thinned first protection film 20a and becomes exposed through the first protection film 20a. This protection film alone would cause device defects, such as short circuit. Thus, a second protection film 20b is spray coated to the first protection film 20a, as shown in FIG. 17B. A photoresist solution is also spray coated to the wafer 11. The spray coating is similar to those described in the first embodiment. Because the spray coating provides relatively uniform protection layer, the thin edge (T) of the first protection film 20b is reinforced without forming large pool of the coating solution in the hole K1. It is noted that when the device does not include the cushioning pad 17, the edge thinning of the first protection film 20a is observed. This thinning is also supplemented by spray coating.

As an alternative to the process steps shown in FIGS. 17A and 17B, the first protection film 20a is formed by spray coating so that the edge portion of the wirings 18 and 19 in the T region is well covered by the first protection film 20a. Then, the second protection film 20b is formed on the first protection film 20a by spin coating. Even though the second protection film 20b formed by spin coating may break at the thin edge (T) as explained above, the edge portion of the wirings 18 and 19 is not exposed, because it is covered by the protection film 20a which has been formed by spray coating. The added spin-coated protection film 20b improves protection against moisture penetration.

Figure 18A:
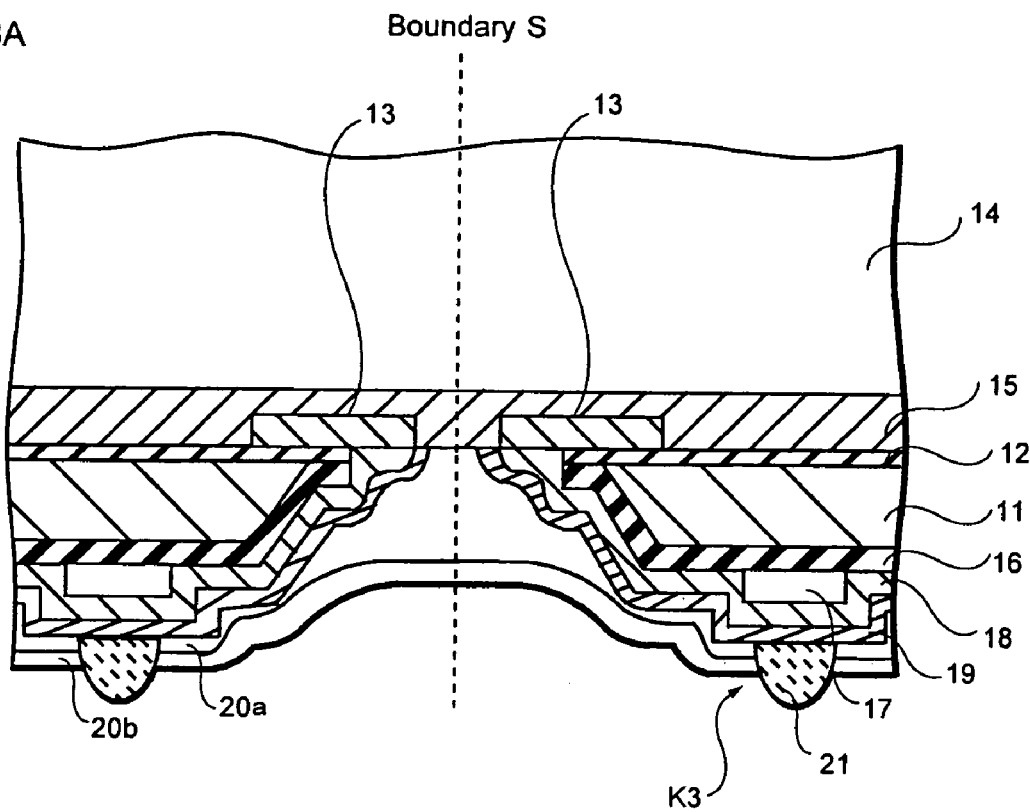
FIGS. 18A and 18B are a cross-sectional views showing the manufacturing method of the semiconductor device according the another embodiment of this invention.
Figure 18B:
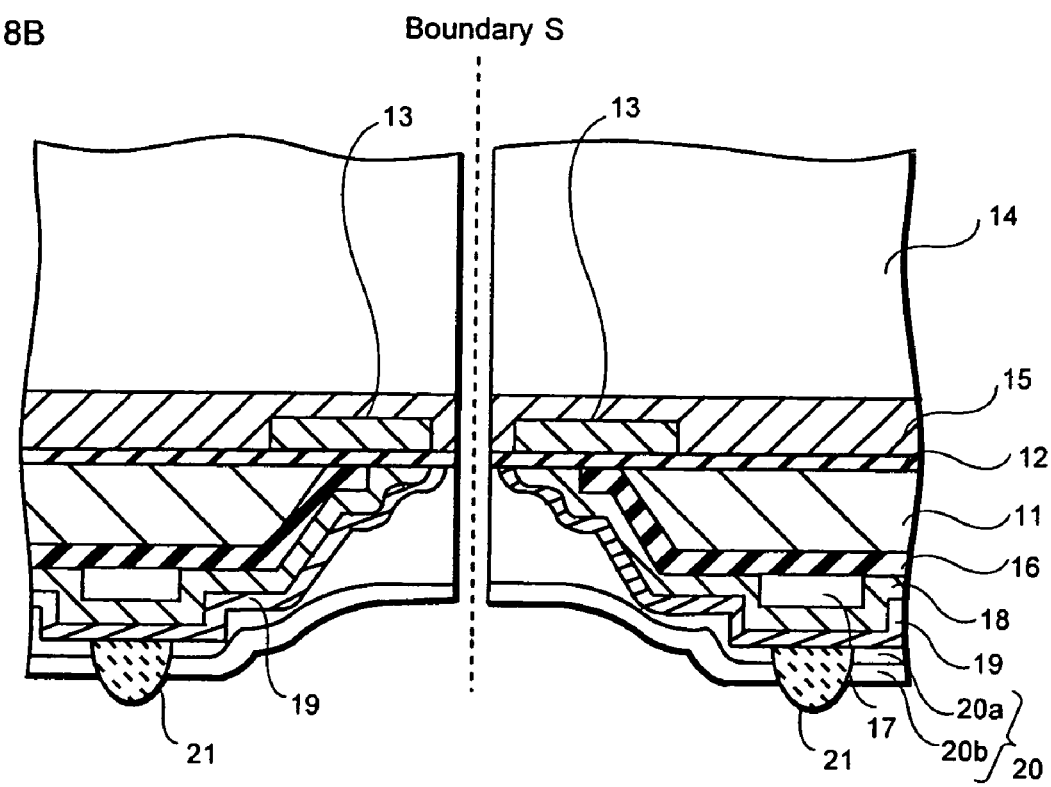

As shown in FIG. 18A, the conductive terminals 21 are formed on the Ni—Au plating film 19 in a manner similar to that described with respect to FIGS. 5-10A. However, a processing method other than the spray coating may be used to form the photoresist mask R. Finally, the wafer 11 and the glass substrate 14 are cut through the dicing line S, as shown in FIG. 18B. It is noted that in some application it is possible to remove the glass substrate 14 after the step of FIG. 18B to produce a semiconductor device.

Figure 19A:
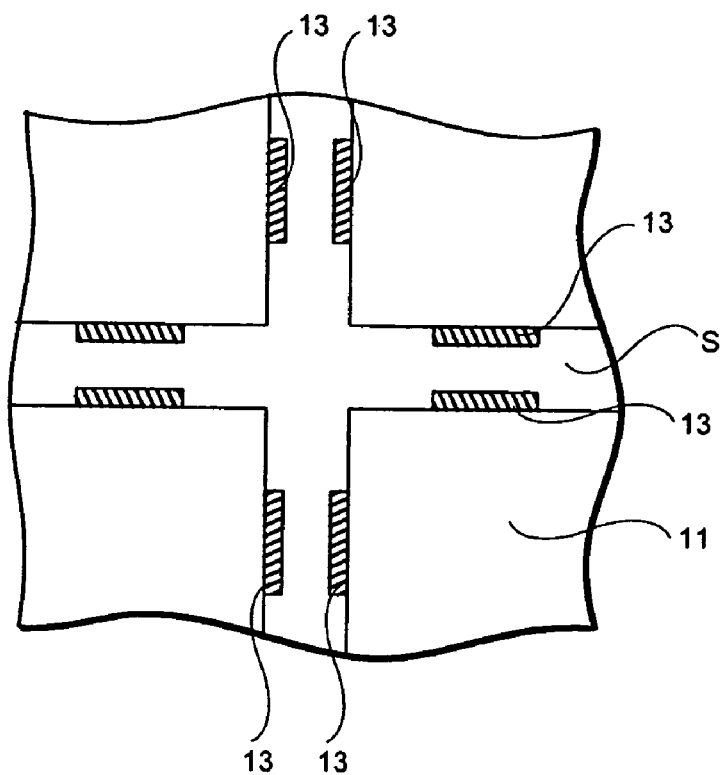
FIGS. 19A and 19B are plan views corresponding to two different horizontal configurations of the semiconductor device according the another embodiment of this invention.
Figure 19B:
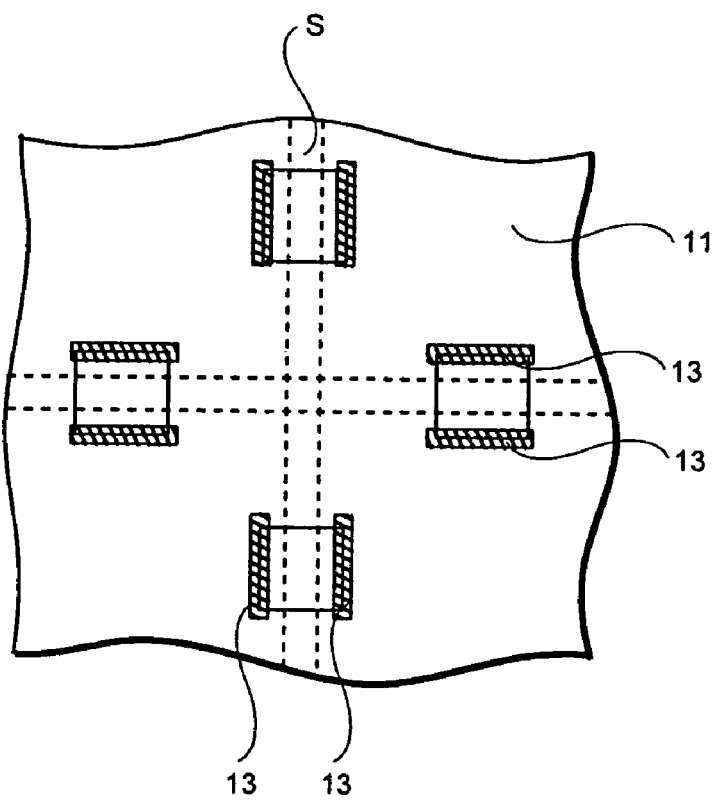

FIGS. 19A and 19B show two examples of the horizontal configuration of the hole K1 shown in FIG. 14B. In the configuration of FIG. 19A, the hole K1 is aligned with the dicing lines S. In other words, on the bottom surface of the wafer 11 the hole K1 form a lattice pattern. On the other hand, in the configuration of FIG. 19B, the holes K1 are formed along the dicing line S but not continuous. The holes K1 are separate pits that expose corresponding first wirings 13.

This invention is applied to the BGA type semiconductor device which has conductive terminals on the back surface of the semiconductor die in the embodiments described above. Not limited to that, this invention may also be applied to a so-called LGA (Land Grid Array) type semiconductor device which has no conductive terminal on the back surface of the semiconductor die. That is, the semiconductor device is formed to have the protection film on the surface of the second wiring, but not to have the conductive terminal in the opening K in the protection film.

When this invention is applied to form the film of the cushioning material, the protection film or the film of the photoresist layer, each of the films mentioned above is formed to have uniform thickness, since the method of this embodiment uses spray coating in which the material to form the film is sprayed making mist of fine particles. When the protection film or the photoresist layer is baked, the semiconductor wafer is prevented from warping, because localized severe shrinking of the protection film or the photoresist layer is suppressed. Yield and reliability of the BGA type semiconductor device are improved with this embodiment by improving accuracy of processing such as the screen printing which requires flatness of the semiconductor wafer.

What is claimed is:
1. A method of manufacturing a semiconductor device, comprising:
   providing a semiconductor wafer comprising a first wiring formed on a front surface thereof;

bonding a supporting substrate to the front surface of the semiconductor wafer;

etching the semiconductor wafer to expose a portion of the first wiring;

forming a second wiring connected with the exposed portion of the first wiring and extending over a back surface of the semiconductor wafer; and forming a protection film on the second wiring by spray coating.

2. The method of claim 1, further comprising forming an opening in the protection film at a predetermined position to expose the second wiring.

3. The method of claim 2, further comprising forming a conductive terminal on the second wiring through the opening in the protection film.

4. The method of claim 1, wherein the protection film comprises an organic resin.

5. The method of claim 4, wherein the organic resin comprises a photoresist resin or an epoxy resin.

6. The method of claim 1, wherein the etching of the semiconductor wafer comprises forming a groove having a shape of a line along a dicing line.

7. The method of claim 1, wherein the etching of the semiconductor wafer comprises forming pits that are discrete along a dicing line.

8. A method of manufacturing a semiconductor device, comprising:

providing a semiconductor wafer comprising a first insulation film formed on a front surface thereof and a first wiring formed on the first insulation film;

bonding a supporting substrate to the front surface of the semiconductor wafer;

etching the semiconductor wafer to expose a portion of the first insulation film;

forming a second insulation film to cover a back surface of the semiconductor wafer and the exposed portion of the first insulation film;

etching the first and second insulation films to expose a portion of the first wiring;

forming a second wiring connected with the exposed portion of the first wiring and extending over the second insulation film; and forming a protection film on the second wiring by spray coating.

9. The method of claim 8, further comprising forming an opening in the protection film at a predetermined position to expose the second wiring.

10. The method of claim 9, further comprising forming a conductive terminal on the second wiring through the opening in the protection film.

11. The method of claim 8, wherein the protection film comprises an organic resin.

12. The method of claim 11, wherein the organic resin comprises a photoresist resin or an epoxy resin.

13. The method of claim 8, wherein the etching of the semiconductor wafer comprises forming a groove having a shape of a line along a dicing line.

14. The method of claim 8, wherein the etching of the semiconductor wafer comprises forming pits that are discrete along a dicing line.

15. A method of manufacturing a semiconductor device, comprising:

providing a semiconductor wafer comprising a first wiring formed on a front surface thereof;

bonding a supporting substrate to the front surface of the semiconductor wafer;

etching the semiconductor wafer to expose a portion of the first wiring;

forming a second wiring connected with the exposed portion of the first wiring and extending over a back surface of the semiconductor wafer;

forming a first protection film on the second wiring by spin coating; and forming a second protection film on the second wiring by spray coating.

16. The method of claim 15, further comprising forming an opening in the first and second protection films at a predetermined position to expose a portion of the second wiring.

17. The method of claim 15, further comprising forming a terminal on the exposed portion of the second wiring.

18. The method of claim 15, wherein the first protection film is formed prior to the formation of the second protection film.

19. The method of claim 15, wherein the second protection film is formed prior to the formation of the first protection film.

20. The method of claim 15, wherein the etching of the semiconductor wafer comprises forming a groove having a shape of a line along a dicing line.

21. The method of claim 15, wherein the etching of the semiconductor wafer comprises forming pits that are discrete along a dicing line.

* * * * *